US012706162B2

(12) United States Patent
Hwang et al.

(10) Patent No.: US 12,706,162 B2
(45) Date of Patent: Aug. 11, 2026

(54) METHODS AND APPARATUS FOR PERFORMING A DEEP-ERASE VERIFICATION OPERATION

(71) Applicant: SK hynix Inc., Icheon-si (KR)

(72) Inventors: Sung Hyun Hwang, Icheon-si (KR); Jae Yeop Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 197 days.

(21) Appl. No.: 18/399,157

(22) Filed: Dec. 28, 2023

(65) Prior Publication Data

US 2025/0069674 A1 Feb. 27, 2025

(30) Foreign Application Priority Data

Aug. 22, 2023 (KR) ........................ 10-2023-0110004

(51) Int. Cl.

*G11C 16/34* (2006.01)
*G11C 16/04* (2006.01)
*G11C 16/08* (2006.01)
*G11C 16/14* (2006.01)
*G11C 16/24* (2006.01)

(52) U.S. Cl.

CPC .......... *G11C 16/3445* (2013.01); *G11C 16/08* (2013.01); *G11C 16/14* (2013.01); *G11C 16/24* (2013.01); *G11C 16/0483* (2013.01)

(58) Field of Classification Search

CPC ..... G11C 16/3445; G11C 16/08; G11C 16/14; G11C 16/24; G11C 16/0483
USPC ..................................................... 365/185.22
See application file for complete search history.

(56) References Cited

U.S. PATENT DOCUMENTS 9,343,171 B1 5/2016 Sun et al.
2018/0019015 A1* 1/2018 Kwon .................... G11C 16/08
2024/0420772 A1* 12/2024 Park ..................... G11C 16/107

FOREIGN PATENT DOCUMENTS

KR 1020090049373 A 5/2009

* cited by examiner

*Primary Examiner* — Amir Zarabian
*Assistant Examiner* — Daniel John King
(74) *Attorney, Agent, or Firm* — WILLIAM PARK AND ASSOCIATES LTD.

(57) ABSTRACT

A semiconductor device includes a memory cell array and a peripheral circuit. The memory cell array is coupled to a plurality of word lines and a plurality of bit lines. The peripheral circuit performs a deep-erase verification operation to determine whether a target memory cell has a threshold voltage that is lower than a first negative reference voltage by applying a second negative reference voltage that is lower than the first negative reference voltage to the target memory cell.

18 Claims, 9 Drawing Sheets

METHODS AND APPARATUS FOR PERFORMING A DEEP-ERASE VERIFICATION OPERATION

CROSS-REFERENCES TO RELATED APPLICATION

The present application claims priority under 35 U.S.C. § 119(a) to Korean application number 10-2023-0110004 filed on Aug. 22, 2023, in the Korean Intellectual Property Office, which is incorporated herein by reference in its entirety as set forth in full.

BACKGROUND

1. Technical Field

Various embodiments generally relate to a semiconductor device.

2. Related Art

An electronic device includes many electronic components, and a computer system may include many electronic components comprising semiconductors. Among the semiconductor devices constituting a computer system, a host device, such as a processor or memory controller, may be in data communication with a memory device. The memory device may include a plurality of memory cells, which may be characterized by word lines and bit lines, to store data.

A memory cell can have a threshold voltage lower than 0 V in an erased state. However, a memory cell having too low a threshold voltage, i.e., deep-erase cell, can cause reliability issues. Therefore, an effective method for identifying deep-erase cell may be required.

SUMMARY

In an embodiment, a semiconductor device may include a memory cell array and a peripheral circuit. The memory cell array may be configured to be coupled to a plurality of word lines and a plurality of bit lines. The peripheral circuit may be configured to perform a deep-erase verification operation to determine whether a target memory cell has a threshold voltage that is lower than a first negative reference voltage by applying a second negative reference voltage that is lower than the first negative reference voltage to the target memory cell.

In an embodiment, a semiconductor device may include a memory cell array, a control circuit, a decoder, and a buffer circuit. The memory cell array may be configured to be coupled to a plurality of word lines and a plurality of bit lines. The control circuit may be configured to control a deep-erase verification operation for determining whether a target memory cell coupled to a target word line is a deep-erase cell having a threshold voltage that is lower than a first negative reference voltage. The decoder may be configured to, under control of the control circuit, apply a second negative reference voltage to the target word line in the deep-erase verification operation. The buffer circuit may be configured to, under control of the control circuit, determine a state of a bit line coupled to the target memory cell in the deep-erase verification operation.

In an embodiment, a semiconductor device may include memory cells and a peripheral circuit. The memory cells may be configured to be coupled to a plurality of word lines. The peripheral circuit may be configured to perform a deep-erase verification operation on a target memory cell coupled to a target word line by applying a negative reference voltage to the target word line, applying the negative reference voltage to a subsequent word line of the target word line, and applying a pass voltage to remaining word lines.

DETAILED DESCRIPTION

Hereinafter, embodiments of the present disclosure will be described in more detail with reference to the accompanying drawings.

Figure 1:
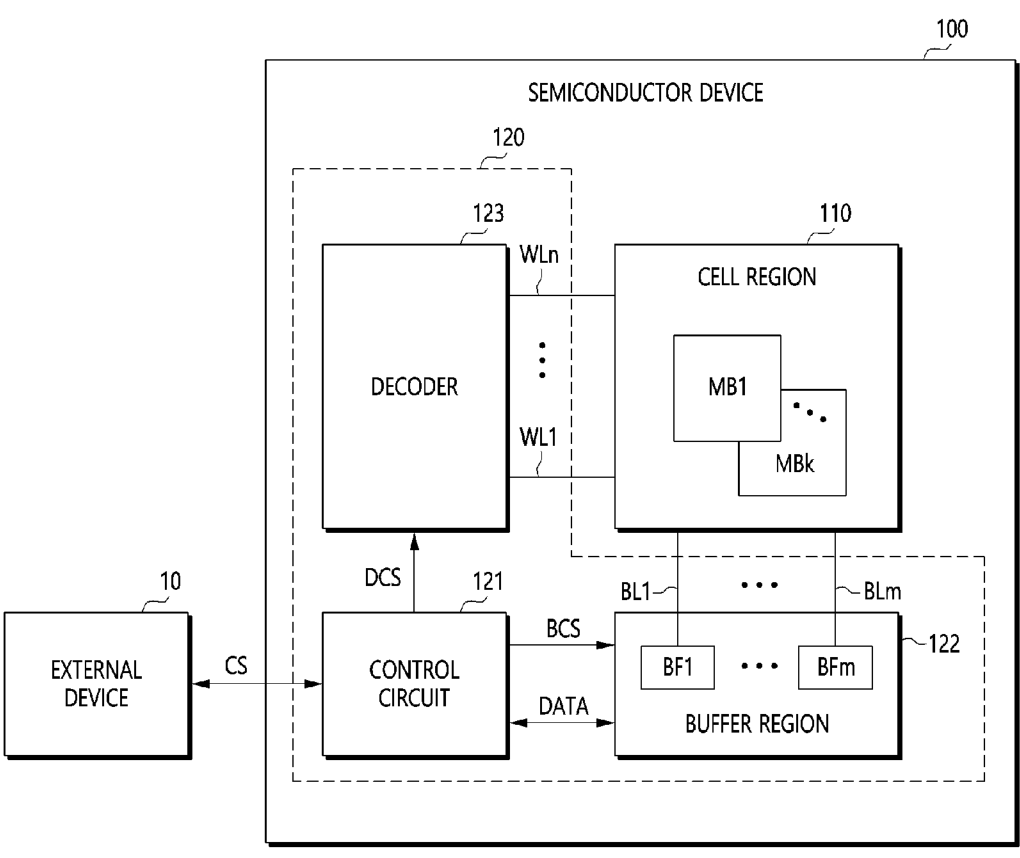
FIG. 1 is a block diagram illustrating a semiconductor device according to an embodiment.

FIG. 1 is a block diagram illustrating a semiconductor device 100 according to an embodiment. Referring to FIG. 1, the semiconductor device 100 may operate under the control of an external device 10, such as a controller. The semiconductor device 100 may transmit and receive signals CS to and from the external device 10. The signals CS may include, for example, commands, addresses, data, and the like. In response to the signals CS transmitted from the external device 10, the semiconductor device 100 may perform various internal operations, such as program operations, read operations, erase operations, and the like.

The semiconductor device 100 may be a semiconductor memory device. The semiconductor memory device may be a NAND Flash memory, a 3D NAND Flash memory, a NOR Flash memory, Resistive Random Access Memory, a Phase-Change Memory, a Magnetoresistive Random Access Memory, a Ferroelectric Random Access Memory, or a Spin Transfer Torque Random Access Memory.

The semiconductor device 100 may include a cell region 110 and peripheral circuit 120. The cell region 110 may include a plurality of memory blocks MB1 to MBk. The memory block may be the unit of measurement in which the semiconductor device 100 performs erase operations, i.e., data stored in the memory blocks may be erased simultaneously. Each of the memory blocks MB1 to MBk may be coupled to the peripheral circuit 120 through word lines WL1 to WLn and bit lines BL1 to BLm. Each of the memory blocks MB1 to MBk may include a memory cell array in which data is stored. The memory cell array may include a plurality of memory cells coupled to word lines WL1 to WLn and bit lines BL1 to BLm.

The peripheral circuit 120 may perform internal operations on the cell area 110 in response to the signals CS transmitted from the external device 10. In response to the signals CS, the peripheral circuit 120 can store data in the cell area 110 and read data from the cell area 110. The peripheral circuit 120 may include a control circuit 121, a buffer area 122, and a decoder 123. Each of control circuit 121, buffer area 122, and decoder 123 may comprise hardware, software, firmware, or a combination thereof.

The control circuit 121 may control various operations of the semiconductor device 100 based on the signals CS received from the external device 10. For example, the control circuit 121 may generate buffer region control signals BCS in response to the signals CS and may control the buffer region 122 with the buffer region control signals BCS. The control circuit 121 may transmit the data received from the external device 10 to the buffer region 122 and may output the data received from the buffer region 122 to the external device 10. Further, the control circuit 121 may generate decoder control signals DCS in response to the signals CS and may control the decoder 123 with the decoder control signals DCS. The decoder control signals DCS may include, for example, various levels of operating voltages (e.g., program voltage, read voltage, erase voltage, reference voltage, etc.) required in program operation, read operation, and erase operation.

Although not shown, the control circuit 121 may include an interface configured to communicate with the external device 10 and a voltage generation circuit configured to generate various operating voltages.

The buffer region 122 may transfer data to and from the cell region 110 and the control circuit 121. The buffer region 122 may receive data from the control circuit 121 to be stored in the cell region 110 and may store the data. The buffer region 122 may store data read from the cell region 110 until it is output to the control circuit 121.

Buffer region 122 may be associated with each of memory blocks MB1 to MBk through bit lines BL1 to BLm. Buffer region 122 may include buffer circuits BF1 to BFm, each coupled to bit lines BL1 to BLm. The buffer circuits BF1 to BFm may be associated with memory cells through the bit lines BL1 to BLm. The buffer circuits BF1 to BFm may store data to be stored in the memory cells. The buffer circuits BF1 to BFm may store data read from the memory cells. The buffer circuits BF1 to BFm may transfer data to and from the control circuit 121. The buffer circuits BF1 to BFm may operate simultaneously in response to the buffer control signals BCS so that the memory cells coupled to the bit lines BL1 to BLm, respectively, may be accessed simultaneously.

Further, each of the buffer circuits BF1 to BFm may determine a state of the bit line (i.e., a voltage level of the bit line or an amount of current flowing in the bit line) that is changed according to the state of the memory cell in a verification operation for determining the state of the memory cell (i.e., a normal verification operation and a deep-erase verification operation to be described later). For example, each of the buffer circuits BF1 to BFm may precharge the bit line in a first interval, stop precharging the bit line so that the state of the bit line changes according to the state of the memory cell in a second interval, and determine the state of the bit line in a third interval. Each of the buffer circuits BF1 to BFm may determine the state of the memory cell based on the state of the bit line. According to an embodiment, each of the buffer circuits BF1 to BFm may include a precharge circuit configured to supply a voltage to precharge the bit line in response to a precharge signal and a connection circuit configured to connect the bit line to the precharge circuit in response to a connection signal. The precharge signal and the connection signal may be transmitted from the control circuit 121 as buffer region control signals BCS.

The decoder 123 may be associated with each of the memory blocks MB1 through MBk via word lines WL1 through WLn. The decoder 123 may, under the control of the control circuit 121, select one or more of the word lines WL1 to WLn that are coupled to the memory cells to which the program operation, read operation, or erase operation is to be performed and may apply various operating voltages to the selected word lines.

The peripheral circuit 120 may apply a second negative reference voltage, which is smaller than a first negative reference voltage, to the target memory cell to perform a deep-erase verification operation to determine if the target memory cell is a deep-erase cell having a threshold voltage lower than the first negative reference voltage. For example, when the first negative reference voltage is −3.5V, the second negative reference voltage may be −2.5V. In other words, the peripheral circuit 120 does not use the first negative reference voltage, which is the actual reference for determining the deep-erase cell, but instead performs the deep-erase verification operation using the second negative reference voltage, thereby reducing a circuit burden for generating a large negative voltage.

To perform deep-erase verification operations using a second negative reference voltage instead of a first negative reference voltage, the peripheral circuit 120 may be configured and operated according to various embodiments. Specifically, according to an embodiment, the peripheral circuit 120 may apply a second negative reference voltage to a target word line coupled to a target memory cell and a subsequent word line, in the program sequence, to the target word line. And while the peripheral circuit 120 is applying the second negative reference voltage to the target word line and the subsequent word line, it can apply a pass voltage to the remaining word lines.

According to an embodiment, the peripheral circuit 120 may apply a connection signal to each of the buffer circuits BF1 through BFm in the deep-erase verification operation. The connection signal may be generated at a voltage level that is lower than the voltage level at which the connection signal is generated in the normal verification operation. Each of the buffer circuits BF1 through BFm may precharge a bit line in response to the connection signal in the first interval of the normal verification operation, the bit line being precharged to a voltage level that is lower than the voltage level at which the bit line is precharged in the first interval of the deep-erase verification operation.

Depending on an embodiment, a second interval in the deep erase verification operation may be shorter than a second interval in the normal verification operation. The control circuit 121 may control the buffer circuits BF1 through BFm via the buffer area control signals BCS so that the second interval in the deep erase verification operation is shorter than the second interval in the normal verification operation.

After performing the deep-erase verification operation, the peripheral circuit 120 may perform a management operation, which may include an operation to apply a program pulse to the deep-erase cell. The peripheral circuit 120 may perform the management operation before performing the program operation on a preceding word line of the target word line associated with the target memory cell. The preceding word line may be an adjacent word line of the target word line, which precedes the target word line in the program sequence.

Figure 2:
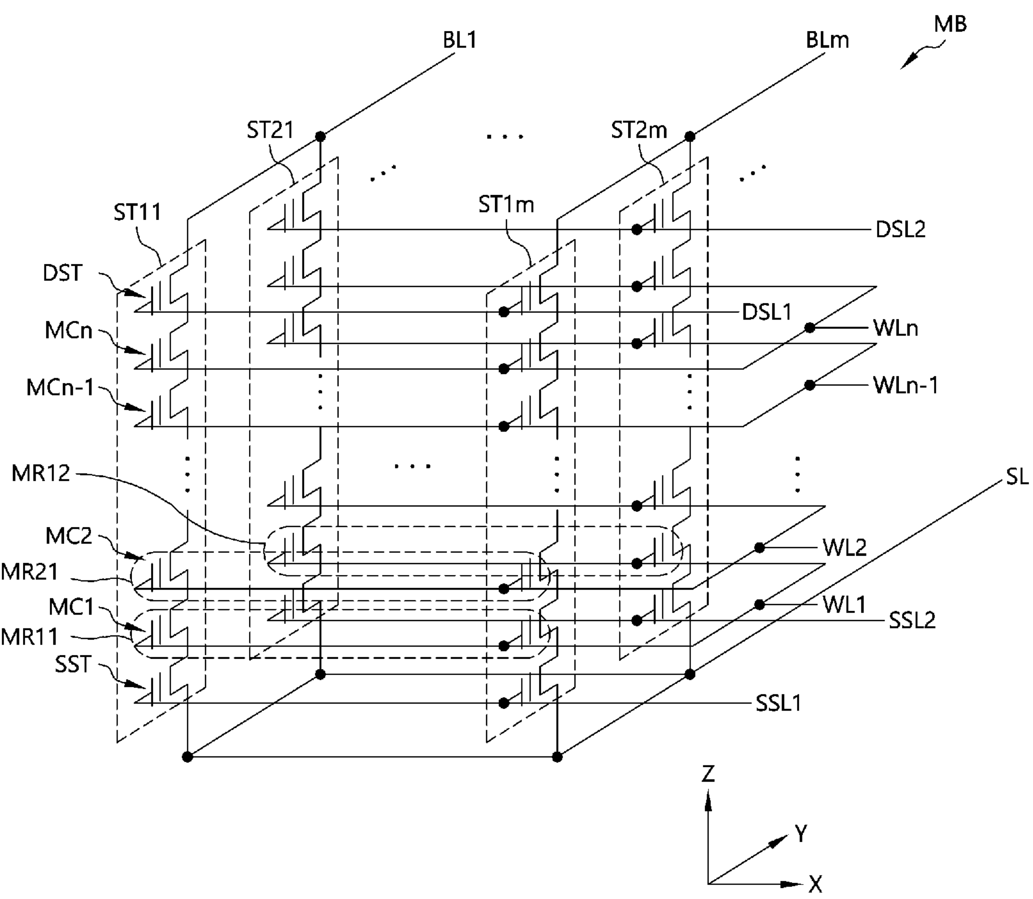
FIG. 2 is a block diagram illustrating a memory block according to an embodiment.

FIG. 2 is a schematic illustrating a memory block MB according to an embodiment. Each of the memory blocks MB1 to MBk in FIG. 1 may be configured similarly to the memory block MB in FIG. 2.

Referring to FIG. 2, the memory block MB may include strings ST11 through ST1_m_, ST21 through ST2_m_. Each of the strings ST11 through ST1_m_, ST21 through ST2_m_ may extend along a vertical direction (Z direction). Within the memory block MB, m strings may be arranged in a row direction (X direction). In FIG. 2, two strings are shown arranged in a column direction (Y direction), but this is for illustrative purposes only, and three or more strings may be arranged in the column direction (Y direction).

The strings ST11 through ST1_m_, ST21 through ST2_m_ may be configured identically. For example, string ST11 may include a source selection transistor SST, memory cells MC1 through MCn, and a drain selection transistor DST connected in series with each other between source line SL and bit line BL1. A source of the source selection transistor SST may be connected to a source line SL, and a drain of the drain selection transistor DST may be connected to the bit line BL1. The memory cells MC1 to MCn may be connected in series with each other between the source selection transistor SST and the drain selection transistor DST. According to an embodiment, a plurality of source selection transistors may be connected in series between the source line SL and the memory cell MC1. According to an embodiment, a plurality of drain selection transistors may be connected in series between bit line BL1 and memory cell MCn.

Source selection transistors at the same position in the vertical direction may be organized as shown below. Specifically, the gates of the source selection transistors of the strings arranged in the same row may be connected to the same source selection line. For example, the gates of the source selection transistors of the strings ST11 through ST1_m_ in the first row may be connected to the source selection line SSL1. For example, the gates of the source selection transistors of the second row of strings ST21 through ST2_m_ may be connected to the source selection line SSL2.

In an embodiment, the source selection transistors of two or more rows of strings may be connected in common to a single source selection line. For example, the source selection transistors of the first and second rows of strings ST11 through ST1_m_, ST21 through ST2_m_ may be connected in common to one source selection line, and the source selection transistors of the third and fourth rows of strings may be connected in common to one source selection line.

The drain selection transistors at the same position in the vertical direction may be configured as shown below. Specifically, the gates of the drain selection transistors of the strings arranged in the same row may be connected to the same drain selection line. For example, the gates of the drain selection transistors of the strings ST11 through ST1_m_ in the first row may be connected to the drain selection line DSL1. For example, the gates of the drain selection transistors of the second row of strings ST21 through ST2_m_ may be connected to the drain selection line DSL2.

Strings arranged in the same column may be connected to the same bit line. For example, strings ST11, ST21 in the first column may be connected to bit line BL1. For example, strings ST1_m_, ST2_m_ in the mth column may be connected to bit line BLm.

Gates of memory cells at the same location in the vertical direction may be coupled to the same word line. For example, memory cells in strings ST11 through ST1_m_ and ST21 through ST2_m_ that are in the same vertical position as memory cell MC1 may be coupled to word line WL1.

Among the memory cells, memory cells coupled to the same word line in the same row can constitute one memory region MR11. For example, the memory cells coupled to word line WL1 in the first row may comprise one memory region MR11. For example, the memory cells coupled to the word line WL1 in the second row may comprise one memory region MR12. For example, the memory cells coupled to word line WL2 in the first row may comprise one memory region MR21. Depending on the number of rows, each word line may be associated with multiple memory regions. The memory cells comprising one memory region may be accessed simultaneously.

According to an embodiment, the memory block MB may be further coupled to one or more dummy word lines other than the word lines WL1 through WLn. In this case, the memory block MB may further comprise dummy memory cells coupled to the dummy word lines.

Figure 3:
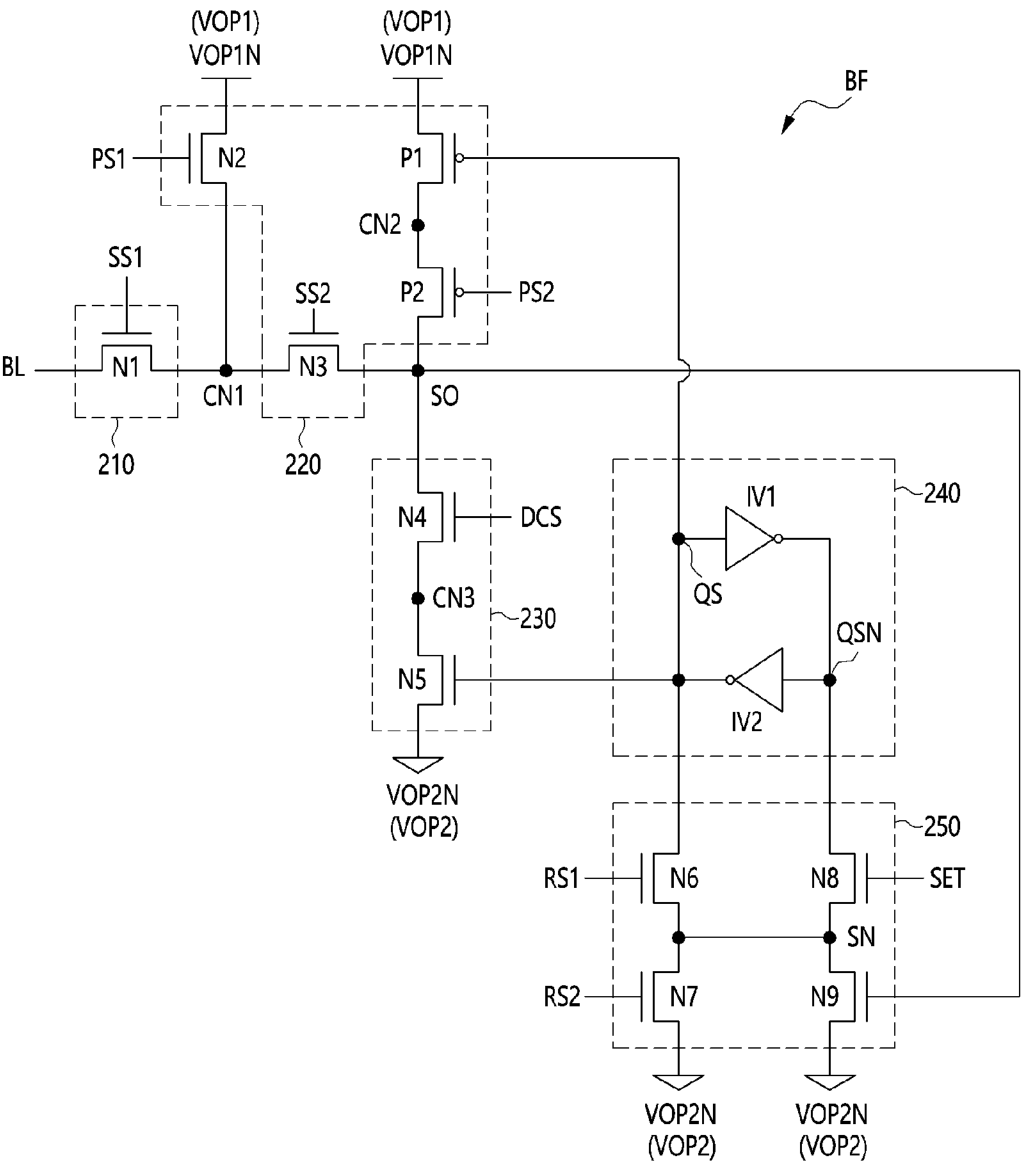
FIG. 3 is a schematic diagram illustrating a buffer circuit according to an embodiment.

Referring to FIG. 3, in a verification operation, the buffer circuit BF may pre-charge the bit line BL and the sensing node SO, determine the state of the sensing node SO that is changed by the state of the bit line BL, and store a value corresponding to the determination result. The state of the bit line BL may be determined by the state of the target memory cell coupled to the bit line BL. Therefore, the value stored according to the state of the sensing node SO may refer to the state of the bit line BL and the state of the target memory cell. The buffer circuit BF may operate in response to buffer control signals BCS transmitted from the control circuit 121. The buffer control signals BCS may include a connection signal SS1, a sensing signal SS2, a first precharge signal PS1, a second precharge signal PS2, a discharge signal DCS, a set signal SET, a first reset signal RS1, and a second reset signal RS2.

The buffer circuit BF may include a connection circuit 210, a precharge circuit 220, a discharge circuit 230, a storage circuit 240, and a set circuit 250.

The connection circuit 210 may be coupled between the bit line BL and the first intermediate node CN1. The connection circuit 210 may connect the bit line BL to the first intermediate node CN1 in response to an enabled connection signal SS1. The connection circuit 210 may pass a voltage supplied from the precharge circuit 220 to the bit line BL in response to the enabled connection signal SS1 (logic high). The connection circuit 210 may disconnect the bit line BL from the first intermediate node CN1 in response to the disabled connection signal SS1 (logic low). For example, the connection circuit 210 may include a first NMOS transistor N1. The first NMOS transistor N1 may connect the bit line BL to the first intermediate node CN1 in response to an enabled connection signal SS1. The first NMOS transistor N1 may disconnect the bit line BL from the first intermediate node CN1 in response to the disabled connection signal SS1.

The precharge circuit 220 may connect the first operating voltage node VOP1N to the first intermediate node CN1 in response to an enabled first precharge signal PS1 (logic high). The precharge circuit 220 may precharge the first intermediate node CN1 using the first operating voltage VOP1 in response to the enabled first precharge signal PS1.

The precharge circuit 220 may disconnect the first operating voltage node VOP1N from the first intermediate node CN1 in response to a disabled first precharge signal PS1 (logic low). The precharge circuit 220 may connect the first operating voltage node VOP1N to the sensing node SO in response to a logic low value of the data node QS and an enabled second precharge signal PS2. The precharge circuit 220 may precharge the sensing node SO using the first operating voltage VOP1 in response to the logic low value of the data node QS and the enabled second precharge signal PS2. The precharge circuit 220 may connect the first intermediate node CN1 to the sensing node SO in response to the enabled sensing signal SS2. The precharge circuit 220 may disconnect the first intermediate node CN1 from the sensing node SO in response to the disabled sensing signal SS2.

For example, the precharge circuit 220 may include a second NMOS transistor N2, a first PMOS transistor P1, a second PMOS transistor P2, and a third NMOS transistor N3. The second NMOS transistor N2 may connect the first operating voltage node VOP1N to the first intermediate node CN1 in response to the enabled first precharge signal PS1 (logic high). The second NMOS transistor N2 may disconnect the first operating voltage node VOP1N from the first intermediate node CN1 in response to the disabled first precharge signal PS1 (logic low). The first PMOS transistor P1 may connect the first operating voltage node VOP1N to the second intermediate node CN2 in response to a logic low value of the data node QS. The first PMOS transistor P1 may disconnect the first operating voltage node VOP1N from the second intermediate node CN2 in response to a logic high value of the data node QS. The second PMOS transistor P2 may connect the second intermediate node CN2 to the sensing node SO in response to an enabled second precharge signal PS2 (logic low). The second PMOS transistor P2 may disconnect the second intermediate node CN2 from the sensing node SO in response to a disabled second precharge signal PS2 (logic high). The third NMOS transistor N3 may connect the first intermediate node CN1 to the sensing node SO in response to an enabled sensing signal SS2 (logic high). The third NMOS transistor N3 may disconnect the first intermediate node CN1 from the sensing node SO in response to a disabled sensing signal SS2 (logic low).

The discharge circuit 230 may be coupled between the sensing node SO and the second operating voltage node VOP2N. The second operating voltage node VOP2N may be a node to which the second operating voltage VOP2 is supplied. The second operating voltage VOP2 may be, for example, a ground voltage. The second operating voltage VOP2 may be an internal ground voltage generated by the control circuit 121 based on the ground voltage supplied from the controller 10. The discharge circuit 230 may connect the sensing node SO to the second operating voltage node VOP2N in response to a logic high value of the data node QS and an enabled charge signal DCS. The discharge circuit 230 can discharge the sensing node SO in response to a logic high value of the data node QS and an enabled charge signal DCS. For example, the discharge circuit 230 may include a fourth NMOS transistor N4 and a fifth NMOS transistor N5. The fourth NMOS transistor N4 may connect the sensing node SO to the third intermediate node CN3 in response to an enabled discharge signal DCS (logic high). The fourth NMOS transistor N4 may disconnect the sensing node SO from the third intermediate node CN3 in response to a disabled discharge signal DCS (logic low). The fifth NMOS transistor N5 may connect the third intermediate node CN3 to the second operating voltage node VOP2N in response to a logic high value of the data node QS. The fifth NMOS transistor N5 may disconnect the third intermediate node CN3 from the second operating voltage node VOP2N in response to a logic low value of the data node QS.

The storage circuit 240 may store a value corresponding to a voltage level of the sensing node SO. For example, the storage circuit 240 may include first and second inverters IV1 and IV2. Each of the first and second inverters IV1 and IV2 may be coupled between a data node QS and an inverted data node QSN. The first inverter IV1 may receive an input of a value from the data node QS and may output an inverted value of the input value to the inverted data node QSN. The second inverter IV2 may receive the value of the inverted data node QSN as an input and may output the inverted value of the input value to the data node QS. The first and second inverters IV1 and IV2 may act as latches to maintain the values of the data node QS and the inverted data node QSN.

The set circuit 250 may initialize the storage circuit 240 in response to a first reset signal RS1, a second reset signal RS2, a set signal SET, and the voltage level of the sensing node SO and may store a value corresponding to the voltage level of the sensing node SO in the storage circuit 240. The set circuit 250 may be activated when the voltage level of the sensing node SO is higher than a predetermined voltage. For example, the set circuit 250 may include sixth through ninth NMOS transistors N6 through N9. The sixth NMOS transistor N6 may be coupled between the data node QS and the set node SN. The sixth NMOS transistor N6 may connect the data node QS to the set node SN in response to an enabled first reset signal RS1 (logic high). The sixth NMOS transistor N6 may disconnect the data node QS from the set node SN in response to the disabled first reset signal RS1 (logic low). A seventh NMOS transistor N7 may be coupled between the set node SN and the second operating voltage node VOP2N. The 7th NMOS transistor N7 may connect the set node SN to the second operating voltage node VOP2N in response to an enabled second reset signal RS2 (logic high). The seventh NMOS transistor N7 may disconnect the set node SN from the second operating voltage node VOP2N in response to the disabled second reset signal RS2 (logic low). An eighth NMOS transistor N8 may be coupled between the inverted data node QSN and the set node SN. The 8th NMOS transistor N8 may connect the inverted data node QSN to the set node SN in response to an enabled set signal SET (logic high). The eighth NMOS transistor N8 may disconnect the inverted data node QSN from the set node SN in response to the disabled set signal SET (logic low). The ninth NMOS transistor N9 may be coupled between the set node SN and the second operating voltage node VOP2N. The ninth NMOS transistor N9 may connect the set node SN to the second operating voltage node VOP2N in response to a voltage level of the sensing node SO. The ninth NMOS transistor N9 may connect the set node SN to the second operating voltage node VOP2N when the voltage level of the sensing node SO is higher than the predetermined voltage. The ninth NMOS transistor N9 may disconnect the third node SN from the second operating voltage node VOP2N when the voltage level of the sensing node SO is lower than the predetermined voltage. The predetermined voltage may be a minimum voltage level of the sensing node SO at which the ninth NMOS transistor N9 can be turned on.

Thus, depending on whether the voltage level of the sensing node SO is higher or lower than the predetermined voltage, a value of the data node QS may be determined. For example, when the voltage level of the sensing node SO is lower than the predetermined voltage, the data node QS may store a first value (or, a logic low value), and when the voltage level of the sensing node SO is higher than the predetermined voltage, the data node QS may store a second value (or, a logic high value).

Figure 4:
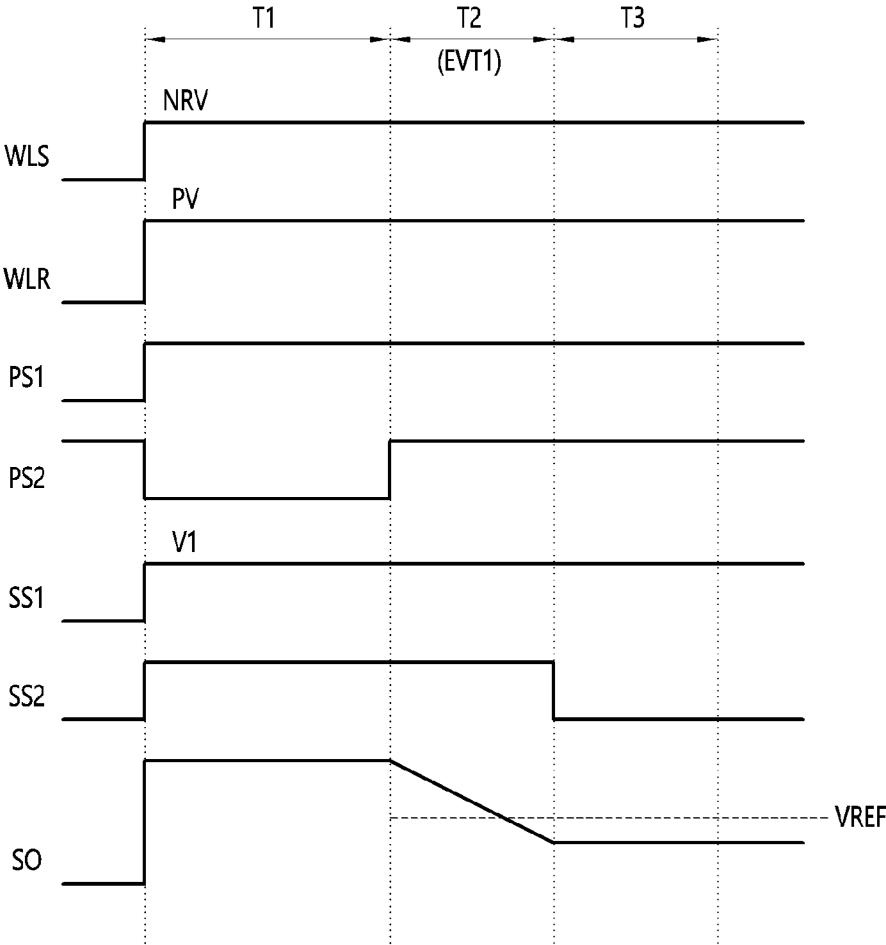
FIG. 4 is a timing diagram to illustrate an operation of the buffer circuit of FIG. 3 in normal verification operation according to an embodiment.

FIG. 4 is a timing diagram to illustrate the operation of the buffer circuit BF of FIG. 3 in a normal verification operation, according to an embodiment.

Referring to FIG. 4, the normal verification operation may be an operation to determine a state of the target memory cell by applying a reference voltage NRV through a target word line WLS to the target memory cell, that is, an operation to determine whether the target memory cell has a threshold voltage that is lower than the reference voltage NRV or a threshold voltage that is higher than the reference voltage NRV. The target memory cell may turn on/off based on its threshold voltage when the reference voltage NRV is applied via the target word line WLS. Specifically, the target memory cell may turn on in response to its threshold voltage being lower than a reference voltage NRV and may turn off in response to its threshold voltage being higher than a reference voltage NRV. The target memory cell may induce a different voltage or current into the bit line BL when turned on and off, and the buffer circuit BF may determine whether the threshold voltage of the target memory cell is lower or higher than the reference voltage NRV by determining the state of the bit line BL.

The threshold voltage NRV may vary depending on which threshold voltage distribution of the target memory cell is to be determined. In FIG. 4, the NRV is illustrated as being a positive voltage, but the NRV may also be a negative voltage. During the normal verification operation, the reference voltage NRV may be applied to the target word line WLS, and a pass voltage PV may be applied to the remaining word lines WLR. The normal verification operation may include a first time interval T1 to a third time interval T3.

The first interval T1 may be a precharge interval T1. In the precharge interval T1, the precharge circuit 220 may precharge the bit line BL, the first intermediate node CN1, and the sensing node SO under the control of the control circuit 121. Specifically, the first NMOS transistor N1 may be turned on in response to the connection signal SS1 transitioning from a logic low level to a logic high level. The second NMOS transistor N2 may be turned on in response to a first precharge signal PS1 transitioning from a logic low level to a logic high level. The third NMOS transistor N3 may be turned on in response to a sensing signal SS2 transitioning from a logic low level to a logic high level. The first PMOS transistor P1 may be turned on in response to a logic low value of the reset data node QS. The second PMOS transistor P2 may be turned on in response to a second precharge signal PS2 transitioning from a logic high level to a logic low level. According to an embodiment, the second precharge signal PS2 and the sensing signal SS2 may be enabled later than the first precharge signal PS1 and the connection signal SS1. The end point of the precharge interval T1 and the start point of the second interval T2 may be defined by the second precharge signal PS2 being disabled.

The second interval T2 may be an evaluation interval T2. In the evaluation interval T2, the state of the bit line BL may be changed according to the state of the target memory cell coupled to the bit line BL, and the voltage level of the sensing node SO may be changed according to the state of the bit line BL. Specifically, the second PMOS transistor P2 may be turned off in response to the second precharge signal PS2 transitioning from a logic low level to a logic high level. Thus, when the target memory cell coupled to the bit line BL is turned on in response to the reference voltage NRV, the voltage level of the sensing node SO may fall as current flows from the sensing node SO through the bit line BL to the source line SL. As shown, when the target memory cell coupled to the bit line BL is turned off in response to the reference voltage NRV, the voltage level at the sensing node SO may be maintained without any current flowing through the bit line BL. The end point of the valuation interval T2 and the start point of the determination interval T3 may be defined by the sensing signal SS2 being disabled. On the other hand, the time of the evaluation interval T2, i.e., the evaluation time EVT1, may be from the time at which the second precharge signal PS2 is deactivated to the time at which the sensing signal SS2 is deactivated. The evaluation time EVT1 may be a time at which the voltage level of the sensing node SO changes according to the state of the bit line BL.

The third interval T3 may be a determination interval T3. In the determination interval T3, the third NMOS transistor N3 may be turned off in response to the sensing signal SS2 transitioning from a logic high level to a logic low level. In the determination interval T3, the sensing node SO may maintain the voltage level of the sensing node SO at the end of the valuation interval T2. The storage circuit 240 may store a value corresponding to the voltage level of the sensing node SO. Specifically, depending on whether the voltage level of the sensing node SO is higher or lower than the predetermined voltage VREF, the value of the data node QS may be determined by turning the ninth NMOS transistor N9 on or off. More specifically, when the voltage level of the sensing node SO is lower than the predetermined voltage VREF, the data node QS may store the first value (or, the logic low value), and based on the value of the data node QS, it may be determined that the target memory cell has a threshold voltage that is lower than the reference voltage NRV, that is, is in the first state. Then, when the voltage level of the sensing node SO is higher than the predetermined voltage VREF, the data node QS may store the second value (or, the logic high value), and based on the value of the data node QS, the target memory cell may be determined to have a threshold voltage that is higher than the reference voltage NRV, that is, to be in the second state.

Figure 5A:
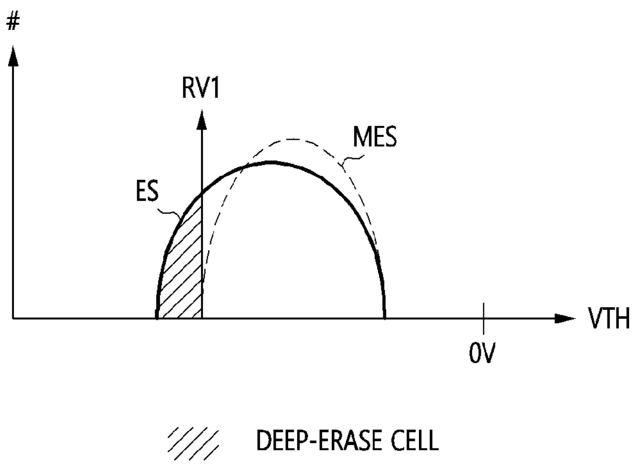
FIG. 5A is a diagram to illustrate management operation for a deep-erase cell according to an embodiment.

FIG. 5A is a diagram to illustrate management operation for deep erase cells, according to an embodiment.

Referring to FIG. 5A, memory cells in an erased state may form a threshold voltage distribution ES. The horizontal axis VTH may represent the threshold voltage of a memory cell, and the vertical axis # may represent the number of memory cells having the corresponding threshold voltages. A deep-erase cell may be a memory cell in the erased state that has a threshold voltage that is significantly lower than the threshold voltage of other memory cells in the erased state. A deep-erase cell can be a memory cell with a threshold voltage lower than the first negative reference voltage RV1. A deep-erased cell may occur due to a variety of causes.

The peripheral circuit 120 may determine a deep-erased cell through a deep-erase verification operation and may then perform a management operation on the deep-erased cell. The management operation may include increasing the threshold voltage of the deep-erase cell. To increase the threshold voltage of the deep-erase cell, a program voltage may be applied to the deep-erase cell. After the management operation is performed, the threshold voltage distribution ES may be changed to a threshold voltage distribution MES.

On the other hand, the lower the first negative reference voltage RV1 becomes for determining the deep-erase cell, the larger the circuit for generating the first negative reference voltage RV1 may be, resulting in more area being wasted within the semiconductor device 100. However, if the deep-erase cell is determined based on a level that is higher than the first negative reference voltage RV1, unnecessary program voltage may be applied to memory cells other than the deep-erase cell in a management operation.

Figure 5B:
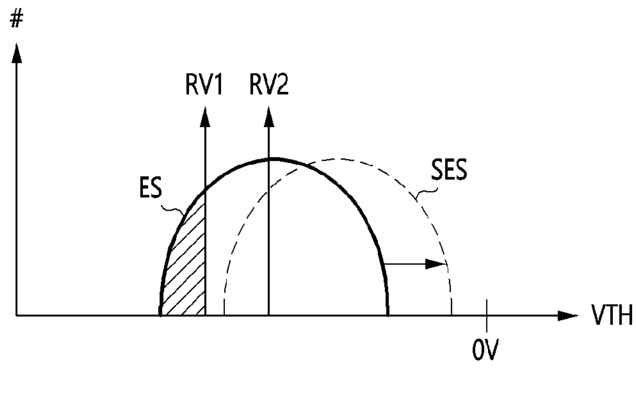
FIG. 5B is a diagram to illustrate a deep-erase verification operation according to an embodiment.

FIG. 5B is a drawing to illustrate a deep-erase verification operation according to an embodiment. Referring to FIG. 5B, the peripheral circuit 120 can determine a deep-erase cell that has a threshold voltage lower than the first negative reference voltage RV1 by using a second negative reference voltage RV2 that is smaller than the first negative reference voltage RV1 instead of the first negative reference voltage RV1.

Specifically, the peripheral circuit 120 may cause the threshold voltage distribution ES of the memory cells to shift in the direction of increasing threshold voltage (hereinafter, referred to as right shift effect) to form the threshold voltage distribution SES. In other words, under the control of the peripheral circuit 120, the memory cells may appear to form a threshold voltage distribution SES when in fact they form a threshold voltage distribution ES. Thus, a deep-erased cell for the threshold voltage distribution ES may be effectively determined even when using a second negative reference voltage RV2.

More specifically, the peripheral circuit 120 may apply a second negative reference voltage RV2 to a target word line WLS associated with the target memory cell in a deep-erase verification operation. When the peripheral circuit 120 determines that the target memory cell has a threshold voltage that is lower than the second negative reference voltage RV2, the peripheral circuit 120 may determine that the target memory cell is actually a deep-erase cell with a threshold voltage that is lower than the first negative reference voltage RV1. And when the target memory cell is determined to have a threshold voltage that is higher than the second negative reference voltage RV2, the peripheral circuit 120 may determine that the target memory cell is not a deep-erase cell with a threshold voltage that is higher than the first negative reference voltage RV1.

Figure 6A:
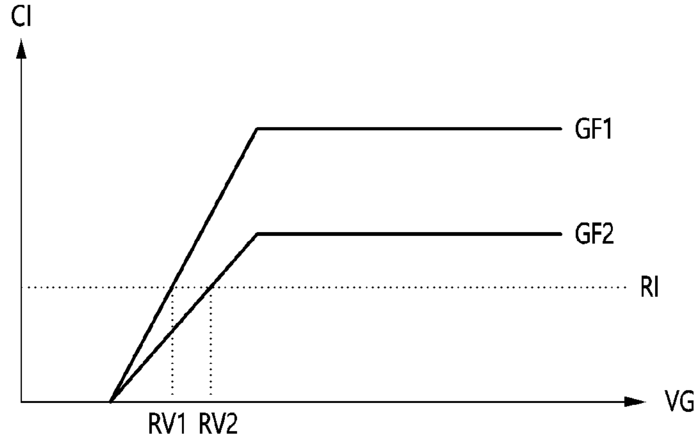
FIGS. 6A and 6B are diagrams for illustrating a method for generating a right shift effect according to an embodiment.
Figure 6B:
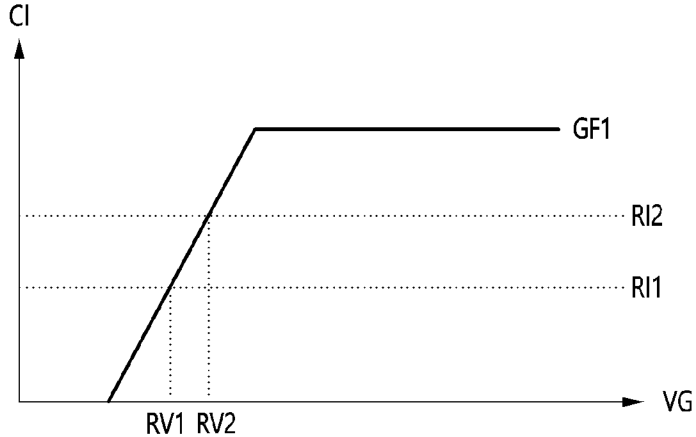

FIGS. 6A and 6B are drawings to illustrate a method for generating a right shift effect according to an embodiment.

Referring to FIG. 6A, a graph GF1 may represent a characterization of a memory cell over a threshold voltage distribution ES. Graph GF1 may represent the amount of current (hereinafter, referred to as cell current CI) flowing through the memory cell to the bit lines for a gate voltage VG applied through the word line to the memory cell. The determination current RI corresponding to the first negative reference voltage RV1 in the graph GF1 may be a criterion for determining whether the threshold voltage of the memory cell is lower or higher than the first negative reference voltage RV1. That is, when the first negative reference voltage RV1 is applied to a target word line, a memory cell, among the memory cells, having a cell current CI that is higher than the determination current RI may be determined to have a threshold voltage that is lower than the first negative reference voltage RV1, and a memory cell having a cell current CI that is lower than the determination current RI may be determined to have a threshold voltage that is higher than the gate voltage VG.

On the other hand, when the cell current CI is reduced with respect to the gate voltage VG, the graph GF1 may be changed to the graph GF2. In graph GF2, the same determination current RI can correspond to a second negative reference voltage RV2, i.e., when the cell current CI is reduced, the state of the memory cells can be determined with a second negative reference voltage RV2 that is smaller than the first negative reference voltage RV1, the same as the result of determining the state of the memory cells with the first negative reference voltage RV1.

In summary, since a right shift effect occurs on the memory cell when the cell current CI of the memory cell is reduced, a second negative reference voltage RV2 that is smaller than the first negative reference voltage RV1 can be used to determine the state of the memory cell.

Referring to FIG. 6B, the determination current RI may be increased, that is, from the first determination current RI1 to the second determination current RI2. In the graph GF1, the gate voltage VG corresponding to the first determination current RI1 may be the first negative reference voltage RV1, and the gate voltage VG corresponding to the second determination current RI2 may be the second negative reference voltage RV2. Therefore, a right shift effect may occur for the memory cell even when the determination current RI is increased, and a second negative reference voltage RV2 that is smaller than the first negative reference voltage RV1 may be used to determine the state of the memory cell.

On the other hand, increasing the determination current RI may mean decreasing the evaluation time EVT1, since the determination current RI and the evaluation time EVT1 may be inversely related to each other according to the equation $I=\Delta Q/t$ (where Q is the amount of charge on the sensing node SO in the evaluation interval T2). Therefore, when decreasing the evaluation time EVT1, a right shift effect may occur for the memory cell.

Figure 7:
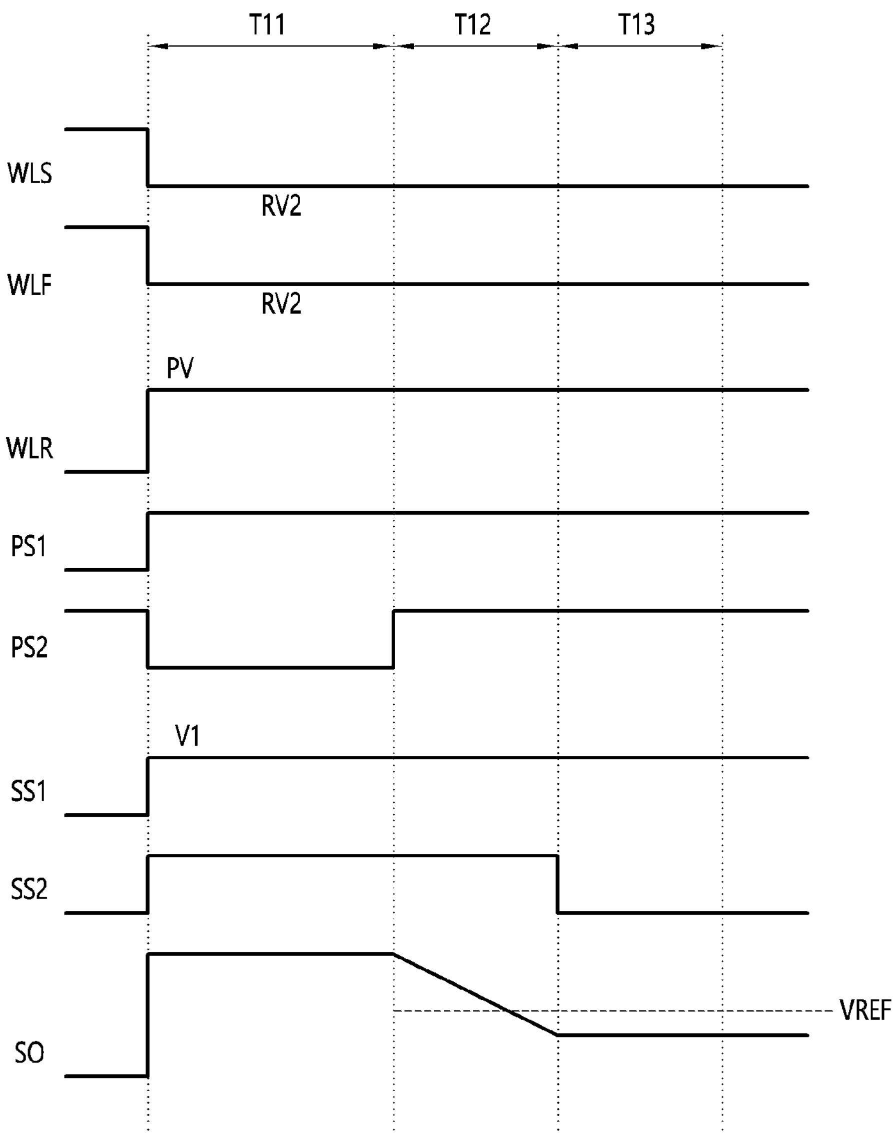
FIG. 7 is a timing diagram illustrating a method for performing a deep erase verification operation according to an embodiment.

FIG. 7 is a timing diagram illustrating a method of performing a deep-erase verification operation according to an embodiment.

Referring to FIG. 7, the peripheral circuit 120 may apply a second negative reference voltage RV2 to the target word line WLS and a subsequent word line WLF of the target word line WLS when performing a deep-erase verification operation on a target memory cell coupled to the target word line WLS. The subsequent word line WLF may be an adjacent word line of the target word line WLS, which follows the target word line in the program sequence. For example, when the target word line is word line WL1, the subsequent word line may be word line WL2.

When a second negative reference voltage RV2 is applied to a memory cell coupled to a subsequent word line WLF, i.e., a subsequent memory cell, through the subsequent word line WLF, the source voltage of the subsequent memory cell may be lower than when a higher pass voltage PV is applied to the subsequent memory cell. Accordingly, the cell current of the target memory cell coupled to the subsequent memory cell may decrease, and a right shift effect may occur, as described with reference to FIG. 6A. As a result, the peripheral circuit 120 may use the second negative reference voltage RV2, instead of the first negative reference voltage RV1, to determine whether there is a deep-erased cell having a threshold voltage that is lower than the first negative reference voltage RV1.

Peripheral circuit 120 may apply a pass voltage PV to the remaining word lines WLR while applying the second negative reference voltage RV2 to the target word line WLS and the subsequent word line WLF. The remaining word lines WLR may be word lines other than the target word line WLS and subsequent word line WLF from all word lines WL1 to WLn coupled to the memory block. The pass voltage PV may be a high voltage capable of fully turning on the memory cell. The other signals, illustrated in FIG. 7, may be controlled similarly as described with reference to FIG. 4.

Figure 8:
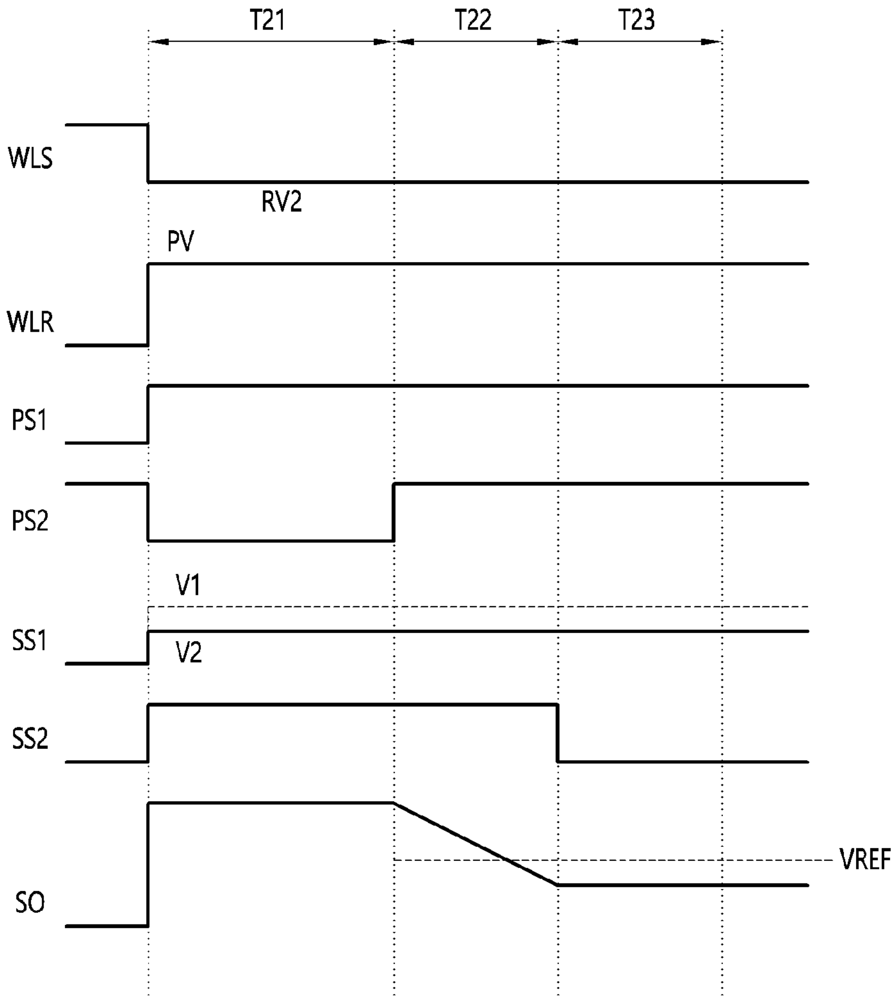
FIG. 8 is a timing diagram illustrating a method for performing a deep erase verification operation according to an embodiment.

FIG. 8 is a timing diagram illustrating a method of performing a deep-erase verification operation according to an embodiment.

Referring to FIG. 8, the control circuit 121 may generate the connection signal SS1 in the deep-erase verification operation at a voltage level V2 that is lower than the voltage level V1 generated in the normal verification operation. In response to the connection signal SS1 of the voltage level V2 in the precharge interval T21 of the deep-erase verification operation, the buffer circuit BF may precharge the bit line BL to a voltage level that is lower than the voltage level at which the bit line BL is precharged in response to the connection signal SS1 of the voltage level V1 in the precharge interval T1 of the normal verification operation.

Accordingly, the cell current IC flowing through the target memory cell may be reduced, and a right shift effect may occur, as described with reference to FIG. 6A. As a result, the peripheral circuit 120 may use a second negative reference voltage RV2, instead of the first negative reference voltage RV1, to determine whether there is a deep-erased cell having a threshold voltage that is lower than the first negative reference voltage RV1. The other signals shown in FIG. 8 may be controlled similarly as described with reference to FIG. 4. In FIG. 8, the remaining word lines WLR may be word lines other than the target word line WLS from all word lines WL1 to WLn coupled to the memory block.

Figure 9:
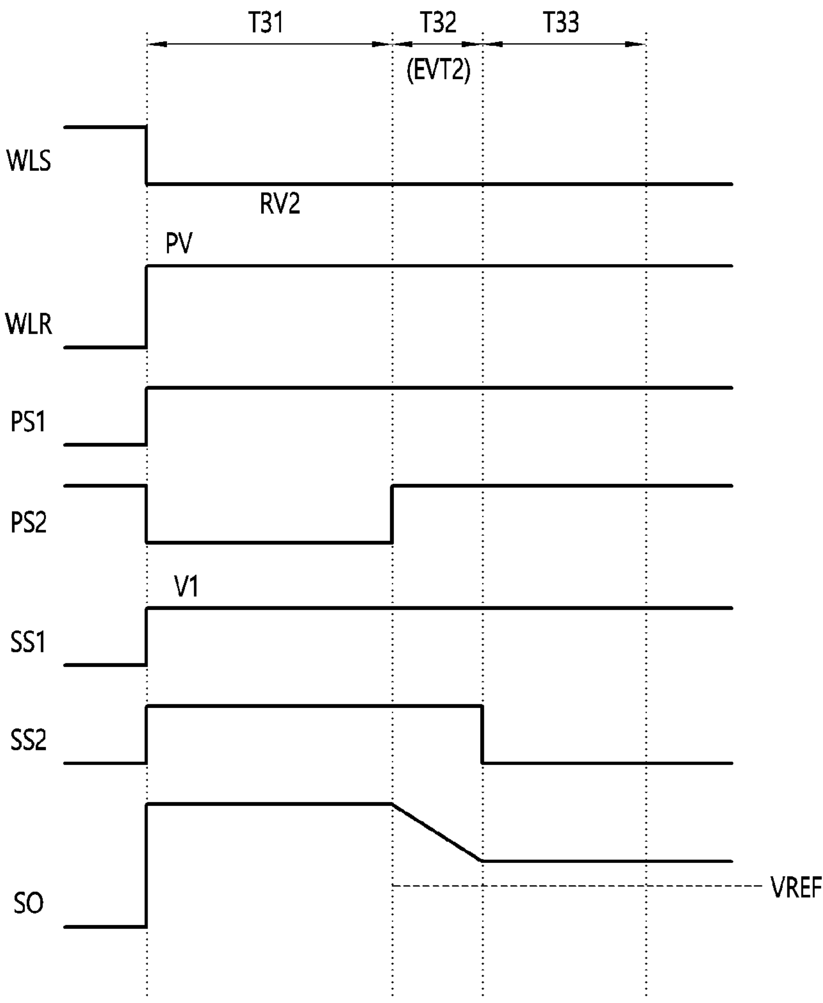
FIG. 9 is a timing diagram illustrating a method of performing a deep erase verification operation according to an embodiment.

FIG. 9 is a timing diagram illustrating a method of performing a deep-erase verification operation according to an embodiment.

Referring to FIG. 9, the control circuit 121 may set the evaluation time EVT2 of the deep-erase verification operation to be shorter than the evaluation time EVT1 of the normal verification operation. For example, the control circuit 121 may set the timing for disabling the sensing signal SS2 in the deep erase verification operation to be earlier than in the normal verification operation Thus, the voltage level of the sensing node SO coupled to the target memory cell may drop less, and it may appear that a right shift effect has occurred with respect to the target memory cell. Furthermore, the right shift effect may occur because decreasing the evaluation time EVT1 to the evaluation time EVT2 corresponds to increasing the first determination current RI1 to the second determination current RI2, as described with reference to FIG. 6B.

As a result, the peripheral circuit 120 may use the second negative reference voltage RV2, instead of the first negative reference voltage RV1, to determine whether there is a deep-erase cell having a threshold voltage that is lower than the first negative reference voltage RV1. The other signals, shown in FIG. 9, may be controlled similarly as described with reference to FIG. 4. In FIG. 9, the remaining word lines WLR may be word lines other than the target word lines WLS from all word lines WL1 to WLn coupled to the memory block.

While certain embodiments have been described above, it will be understood to those skilled in the art that the embodiments described are by way of example only. Accordingly, the semiconductor device should not be limited based on the described embodiments. Rather, the semiconductor device described herein should only be limited in light of the claims that follow when taken in conjunction with the above description and accompanying drawings.

What is claimed is:

1. A semiconductor device comprising:

a memory cell array configured to be coupled to a plurality of word lines and a plurality of bit lines; and a peripheral circuit configured to perform a deep-erase verification operation to determine whether a target memory cell has a threshold voltage that is lower than a first negative reference voltage by applying a second negative reference voltage that is lower than the first negative reference voltage to the target memory cell.

2. The semiconductor device of claim 1, wherein the peripheral circuit is configured to apply the second negative reference voltage to a target word line coupled to the target memory cell and a subsequent word line of the target word line in the deep-erase verification operation.

3. The semiconductor device of claim 2, wherein the peripheral circuit is configured to apply a pass voltage to remaining word lines while applying the second negative reference voltage to the target word line and the subsequent word line.

4. The semiconductor device of claim 1, wherein the deep-erase verification operation and a normal verification operation include a first interval, a second interval, and a third interval, and wherein the peripheral circuit includes a buffer circuit configured to precharge a bit line associated with the target memory cell in the first interval, to cease precharging the bit line so that a state of the bit line changes based on a state of the target memory cell in the second interval, and to determine the state of the bit line in the third interval.

5. The semiconductor device of claim 4, wherein the peripheral circuit is configured to apply a connection signal to the buffer circuit in the deep-erase verification operation, and wherein the connection signal is generated at a voltage level that is lower than a voltage level generated in the normal verification operation.

6. The semiconductor device of claim 5, wherein, in response to the connection signal in the first interval of the deep-erase verification operation, the buffer circuit is configured to precharge the bit line to a voltage level that is lower than a voltage level at which the bit line is precharged in the first interval of the normal verification operation.

7. The semiconductor device of claim 5, wherein the buffer circuit includes:

a precharge circuit configured to supply a voltage to precharge the bit line; and a connection circuit configured to connect the bit line to the precharge circuit in response to the connection signal.

8. The semiconductor device of claim 4, wherein the second interval in the deep-erase verification operation is shorter than the second interval in the normal verification operation.

9. The semiconductor device of claim 1, wherein the peripheral circuit is configured to perform a management operation comprising an operation to apply a program pulse to the target memory cell after performing the deep-erase verification operation.

10. The semiconductor device of claim 9, wherein the peripheral circuit is configured to perform the management operation before performing a program operation on a preceding word line of a target word line associated with the target memory cell.

11. A semiconductor device comprising:

a memory cell array configured to be coupled to a plurality of word lines and a plurality of bit lines;

a control circuit configured to control a deep-erase verification operation for determining whether a target memory cell coupled to a target word line is a deep-erase cell having a threshold voltage that is lower than a first negative reference voltage;

a decoder configured to, under control of the control circuit, apply a second negative reference voltage to the target word line in the deep-erase verification operation; and a buffer circuit configured to, under control of the control circuit, determine a state of a bit line coupled to the target memory cell in the deep-erase verification operation.

12. The semiconductor device of claim 11, wherein the second negative reference voltage is less than the first negative reference voltage.

13. The semiconductor device of claim 11, wherein the decoder is configured to, under the control of the control circuit, apply the second negative reference voltage to a subsequent word line of the target word line and apply a pass voltage to remaining word lines, while applying the second negative reference voltage to the target word line and the subsequent word line.

14. The semiconductor device of claim 11, wherein, before determining the state of the bit line in the deep-erase verification operation, the buffer circuit is configured to, under the control of the control circuit, precharge the bit line to a voltage level that is lower than a voltage level at which the bit line is precharged in a normal verification operation.

15. The semiconductor device of claim 11, wherein the control circuit is configured to control, in the deep-erase verification operation, an evaluation interval during which the state of the bit line changes according to a state of the target memory cell in response to the second negative reference voltage to be shorter than an evaluation interval in a normal verification operation.

16. A semiconductor device comprising:

memory cells configured to be coupled to a plurality of word lines; and a peripheral circuit configured to perform a deep-erase verification operation on a target memory cell coupled to a target word line by applying a negative reference voltage to the target word line and a subsequent word line of the target word line, while applying a pass voltage to remaining word lines.

17. The semiconductor device of claim 16, wherein the peripheral circuit is configured to determine that a target memory cell having a threshold voltage that is lower than an actual negative reference voltage is a deep-erase cell and that a target memory cell having a threshold voltage that is higher than the actual negative reference voltage is not the deep-erase cell, in the deep-erase verification operation.

18. The semiconductor device of claim 17, wherein the negative reference voltage is less than the actual negative reference voltage.

* * * * *